United States Patent
Beregovski et al.

(10) Patent No.: US 9,461,443 B2
(45) Date of Patent: Oct. 4, 2016

(54) OPTICAL SYSTEM HAVING REDUCED POINTING-ERROR NOISE

(71) Applicant: Agilent Technologies, Inc., Loveland, CO (US)

(72) Inventors: Yuri Beregovski, San Jose, CA (US); Miao Zhu, San Jose, CA (US); Adam Kleczewski, San Francisco, CA (US); Varun Raghunathan, Santa Clara, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 12 days.

(21) Appl. No.: 14/179,509

(22) Filed: Feb. 12, 2014

(65) Prior Publication Data

US 2015/0226606 A1    Aug. 13, 2015

(51) Int. Cl.

| | | |
|---|---|---|
| *G01J 1/06* | (2006.01) | |
| *G01J 1/04* | (2006.01) | |
| *H01S 3/00* | (2006.01) | |
| *H01S 5/022* | (2006.01) | |
| *H01S 5/10* | (2006.01) | |
| *H01S 5/14* | (2006.01) | |

(Continued)

(52) U.S. Cl.
CPC .............. *H01S 5/141* (2013.01); *G01J 1/0411* (2013.01); *G01J 1/4257* (2013.01); *H01S 3/1055* (2013.01); *H01S 5/06821* (2013.01); *H01S 2301/02* (2013.01)

(58) Field of Classification Search
CPC ............ H01S 3/098; H01S 3/10; H01S 3/13; H01S 3/0014; H01S 5/02236; H01S 5/10399; H01S 5/141; H04N 1/04; G02B 26/00; G01J 1/00; G01J 1/06; G01J 1/4257; G01J 3/06; G01J 3/12; G01J 3/18; G01J 3/0411
USPC ........... 372/19, 20, 33, 18, 97, 99, 102, 107, 372/108, 29, 32; 250/221; 359/204, 196.1
See application file for complete search history.

(56) References Cited

U.S. PATENT DOCUMENTS

| | | | | |
|---|---|---|---|---|
| 4,025,203 | A | * | 5/1977 | Lee ....................... G02B 7/1821 359/224.1 |
| 4,614,405 | A | * | 9/1986 | Brandenberg ........... G02B 5/06 359/832 |

(Continued)

OTHER PUBLICATIONS

White et al. "Compact diffraction grating laser wavemeter with sub-picometer accuracy and picowatt sensitivity using a webcam imaging sensor", Rev. Sci. Instrum. 83, 113104 (2012), pp. 113104-1-113104-4.*

(Continued)

*Primary Examiner* — John Lee

(57) ABSTRACT

An apparatus having a variable angle light source characterized by a pivot point, a variable response optical receiver, and a first optical system is disclosed. The variable response optical receiver receives light generated by the light source on a receiving surface, the receiver generating a signal indicative of an intensity of light that impinges on a receiving surface. The first optical system images the pivot point to a fixed point relative to the receiver surface. In one aspect of the invention the first optical system is chosen such that light from the variable angle light source covers more& than half the receiving surface. The variable angle light source can include a gain chip in a semiconductor laser having a pivot point located substantially on a facet of the gain chip.

12 Claims, 3 Drawing Sheets

(51) Int. Cl.
  *G01J 1/42*    (2006.01)
  *H01S 3/1055*  (2006.01)
  *H01S 5/068*   (2006.01)

(56) References Cited

U.S. PATENT DOCUMENTS

| | | | | |
|---|---|---|---|---|
| 5,536,925 | A * | 7/1996 | Bard | G06F 1/163 |
| | | | | 235/462.33 |
| 5,956,355 | A * | 9/1999 | Swanson | A61B 1/00183 |
| | | | | 356/479 |
| 6,115,167 | A * | 9/2000 | Genequand | G02B 26/0816 |
| | | | | 359/198.1 |
| 6,704,332 | B2 * | 3/2004 | Chapman et al. | 372/20 |
| 7,714,305 | B2 * | 5/2010 | Visser | G03F 7/70041 |
| | | | | 250/492.1 |
| 8,451,524 | B2 * | 5/2013 | Ortyn | G02B 26/0858 |
| | | | | 356/338 |
| 2006/0132766 | A1 * | 6/2006 | Richman | G01J 3/10 |
| | | | | 356/318 |
| 2009/0136178 | A1 * | 5/2009 | Pirastu | G02B 6/4204 |
| | | | | 385/33 |
| 2009/0207873 | A1 * | 8/2009 | Jansen | H01S 5/02296 |
| | | | | 372/50.12 |
| 2009/0274177 | A1 * | 11/2009 | Fan | B82Y 20/00 |
| | | | | 372/20 |
| 2011/0064099 | A1 * | 3/2011 | Govorkov | H01S 5/0217 |
| | | | | 372/36 |
| 2011/0085221 | A1 * | 4/2011 | Ortyn | G02B 26/0858 |
| | | | | 359/200.8 |
| 2013/0016746 | A1 * | 1/2013 | Strittmatter | B82Y 20/00 |
| | | | | 372/29.015 |
| 2013/0286397 | A1 * | 10/2013 | Witinski | G01J 3/42 |
| | | | | 356/409 |
| 2014/0133509 | A1 * | 5/2014 | Rowlette | G02B 27/0911 |
| | | | | 372/50.1 |
| 2015/0070756 | A1 * | 3/2015 | Priest | B82Y 20/00 |
| | | | | 359/385 |
| 2015/0226606 | A1 * | 8/2015 | Beregovski | G01J 1/06 |
| | | | | 250/552 |

OTHER PUBLICATIONS

Phillips et al."Real-time trace gas sensing of fluorocarbons using a swept-wavelength external cavity quantum cascade laser", Analyst 139, (2014), pp. 2047-2056, First published online Dec. 19, 2013.*

* cited by examiner

OPTICAL SYSTEM HAVING REDUCED POINTING-ERROR NOISE

BACKGROUND

Optical instruments based on light sources that exhibit variations in the angle at which the light beam leaves the light source pose problems when position-sensitive detectors are used to monitor the light beam or the light leaving a sample chamber. For example, tunable lasers often exhibit significant pointing errors. Tunable lasers also exhibit power fluctuations. A correction for the power fluctuations can be provided by a detector that monitors the output of the laser. However, detectors, especially in the mid and far infrared wavelength range, are position sensitive. If the beam shifts position on the detector during the measurements, the signal from the detector will vary even if the light intensity does not change. The pointing errors typically result in such shifts in position, and hence, pose challenges when the detector is used to reduce power fluctuation noise.

SUMMARY

The present invention includes an apparatus having a variable angle light source characterized by a pivot point, a variable response optical receiver, and a first optical system. The variable response optical receiver receives light generated by the light source on a receiving surface, the receiver generating a signal indicative of an intensity of light that impinges on a receiving surface. The first optical system images the pivot point to a fixed point relative to the receiver surface. In one aspect of the invention the first optical system is chosen such that light from the variable angle light source covers more than half the receiving surface.

In another aspect of the invention, the variable angle light source includes a gain chip in a semiconductor laser. The pivot point is located within 5 mm of a facet of the gain chip. The gain chip can be part of an external cavity laser.

In another aspect of the invention, the variable response optical receiver includes a sample cell that is illuminated by the variable angle light source. The receiving surface includes an input plane associated with the sample cell. The first optical system images the pivot point onto a point that is fixed relative to the input plane. A second optical system images a point on an output plane associated with the sample cell onto the fixed point relative to the receiver surface.

DETAILED DESCRIPTION

Figure 1:
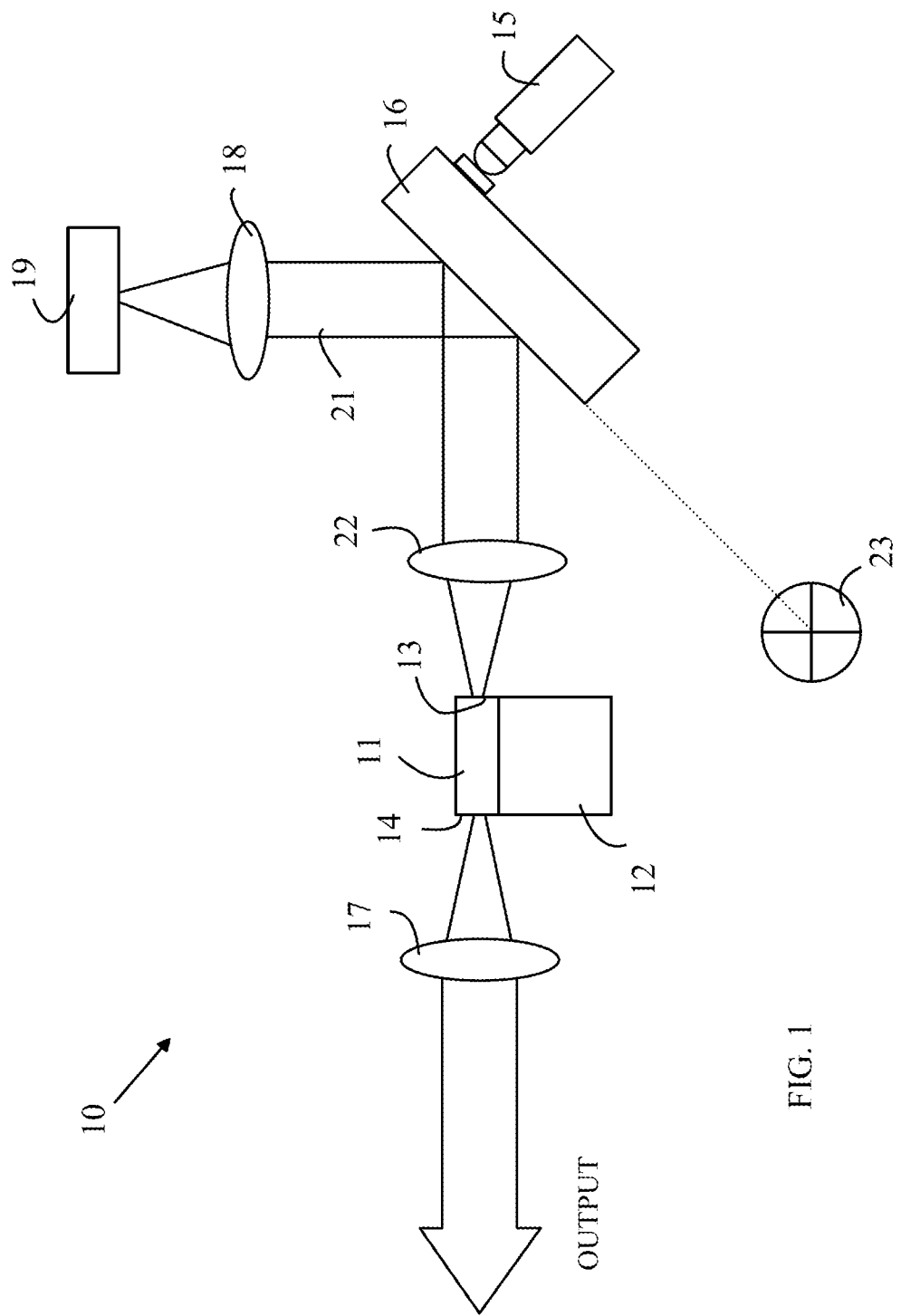
FIG. 1 illustrates an external cavity laser that utilizes the present invention to reduce pointing-error noise.

The manner in which the present invention provides its advantages can be more easily understood with reference to FIG. 1, which illustrates an external cavity laser that utilizes the present invention to reduce pointing-error noise. Laser 10 includes a gain chip 11 that is mounted on a mount 12. Light from the front facet 13 of gain chip 11 is reflected from a grating 16. The angle of grating 16 relative to the light beam from gain chip 11 is chosen to lock the laser on a particular mode. The angle is set by an actuator 15 that rotates the grating around an axis 23 that is chosen such that the reflected wavelength and the length of the cavity are maintained to provide the desired wavelength. Lens 17 expands the output beam to the desired size to provide the output light that is used by the measurement system that utilizes laser 10 as its light source. Lens 22 expands the light leaving front facet 13 of gain chip 11 to a diameter that is set to provide the desired wavelength resolution from grating 16. Larger beam diameters relative to the spacing of the lines on grating 16 provide narrower wavelength bands in the reflected light that reaches gain chip 11.

In laser 10, an optional light output 21 is used to monitor the light intensity in the output beam using a photodetector 19. Light leaving front facet 13 of the gain chip typically exhibits a variation in the angle at which the light leaves that facet. The angle varies in response to mode changes, temperature fluctuations, or other factors. The changes can occur during the course of a measurement that utilizes laser 10 as the light source.

The present invention is based on the observation that the light appears to have a pivot point at or near front facet 13 with the light leaving radially in a narrow range of angles on rays that pass through the pivot point. The variations in this angle lead to a variation in the position of the spot formed by the light in optional light output 21 on photodetector 19 in the absence of lens 18. As noted above, such variations lead to variations in the output of photodetector 19. The present invention overcomes these variations by using lens 18 whose focal length is set such that the pivot point associated with the pointing deviations is imaged onto the light measuring surface of photodetector 19. Hence, variations in the angle of the light leaving front facet 13 do change the position at which the light beam strikes photodetector 19.

In the simplest case, the pivot point is imaged to a point on the surface of photodetector 19. If the pivot point were precisely a point on the surface of the facet, this arrangement would provide the needed immunity for variations in the angle at which the light leaves the pivot point. The resulting detection efficiency would be that of the detector at the point on the detector at which the light strikes the detector. The efficiency of detection at surrounding points on the detector surface would be irrelevant in this case.

However, the pivot point is only approximately a point on the surface of the facet. That is, the pivot point itself can move somewhat relative to the surface of the facet. Typically, the pivot point is within 5 mm of the surface of the facet. The size of the pivot point depends on the particular laser and other factors. If the pivot point moves, the spot on the detector could still wander somewhat depending on the point at which the light left the gain chip. The deviations caused by such residual movement of the spot on the surface of photodetector 19 can be reduced by choosing the focal length of the imaging optics so as to keep these variations of the pivot point image position relative to the light detecting surface of photodetector 19 within certain limits. These limits depend on the non-uniformity of the detector response over the detector area and the maximum pivot angle (greater pivot angle and detector non-uniformity require tighter control of the pivot point image position). In practical cases, the area of the light beam on the light detecting surface of photodetector 19 can still be set to be a desired fraction of the photodetector area (for example, the full width at half-maximum of the beam spot on the photodetector 19 can be matched to the detector diameter). The fraction itself can be related to the pivot point position variations and detector non-uniformity. For example, choosing a spot size larger than the diameter of photodetector 19, while reducing end-to-end system throughput, can reduce the output fluctuations. In one aspect of the present invention, the spot size is between half the area of the light detecting surface and twice the area of the light detecting surface.

Figure 2:
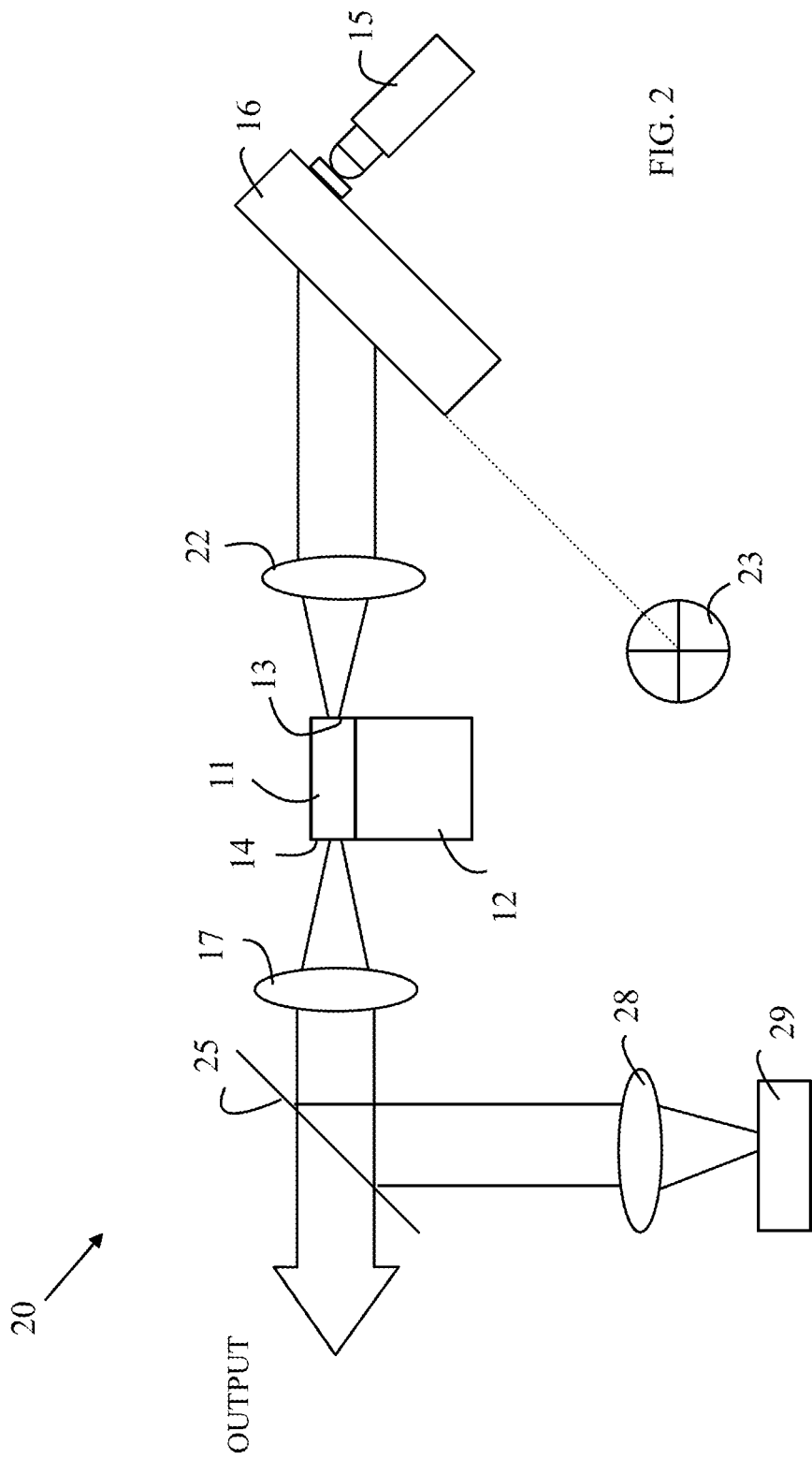
FIG. 2 illustrates another embodiment of an external cavity laser according to the present invention.

In the above-described embodiments, the detector utilized the optional auxiliary beam to monitor the output of the laser. However, other arrangements can be utilized. Refer now to FIG. 2, which illustrates another embodiment of an external cavity laser according to the present invention. To simplify the following discussion, those elements of laser 20 that serve functions analogous to those served by elements of laser 10 have been given the same numeric designation and will not be discussed further here. In laser 20, a partially reflecting mirror 25 is used to divert a portion of the output light to a photodetector 29. In this arrangement, the pivot point of gain chip 11 is located on or near the back facet 14 of gain chip 11. Lens 28 images this pivot point onto photodetector 29 in a manner similar to that discussed above.

Figure 3:
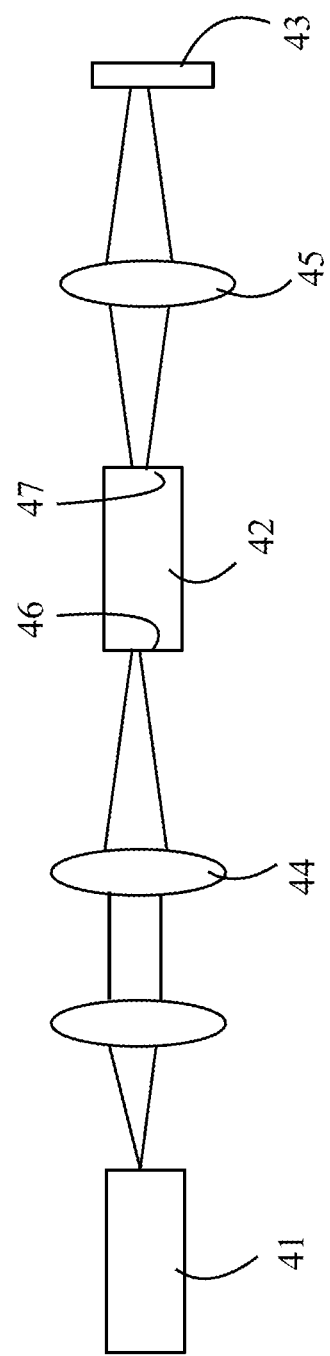
FIG. 3 illustrates a measurement system according to one embodiment of the present invention.

The use of a collecting lens to image the pivot point of the laser so as to reduce beam movement can also be applied to other elements in addition to the detectors discussed above. Refer now to FIG. 3, which illustrates a measurement system according to one embodiment of the present invention. In this system, a laser having a pivot point on one facet is used to illuminate a sample in a sample cell 42. The light leaving sample cell 42 is measured by a detector 43. In the absence of the present invention, the pointing errors introduced by laser 41 would cause the light beam to move with respect to sample cell 42 in a manner that would deleteriously impact the measurements. Sample cell 42 can be modeled as an optical device having an input plane 46 characterized by a spot that the laser light must enter to function properly. This input plane spot is characterized by an input plane spot size. Similarly, light leaving sample cell 42 exits through a spot on an output plane 47. The spot on the output plane is analogous to the pivot point of the laser in that light leaves the spot in a cone of angles that can vary over time. In the present invention, the pivot point of laser 41 is imaged onto the input plane by lens 44 so that it is contained within the input plane spot. The image spot size is chosen such that a substantial portion of the input plane spot is illuminated while ensuring that the image of the pivot point remains within the input plane spot. Similarly, the output plane spot is imaged onto detector 43 by lens 45 in a manner analogous to that described above.

For the purposes of the present discussion, a variable response optical receiver is defined to be a device that generates an electrical signal in response to light impinging on a receiving surface. The signal can be a voltage whose magnitude depends on the intensity of light striking the receiving surface or a current whose magnitude depends on the intensity of light striking the receiving surface. The receiving surface is characterized by a receiving surface area. The conversion of the light intensity to the signal in question depends on the point at which the light strikes the surface, the intensity varying over the surface. The variation in conversion is sufficient to corrupt other processes that depend on the signal to determine the intensity of light in a light signal that is received by the variable response optical receiver. The variations in the response of the receiver with position in some photodetectors can be in the range of 20 percent to 60 percent.

A variable angle light source is defined to be a light source that generates an output light beam that varies in angle of emission over time. The change in angle is sufficient to corrupt measurements that utilize the light from the light source as part of a measurement apparatus. A variable angle light source is characterized by a pivot point that defines a small region through which the light beam passes as the angle of emission varies. In one aspect of the invention, the region has a maximum dimension of less than 5 mm.

In the above-described embodiments, the detectors shown at 19, 29, and 43 are examples of relatively simple variable response optical receivers. However, the combination of sample cell 42 and detector 43 could also be viewed as a variable response optical receiver. In this case, the input plane 46 of sample cell 42 is the receiving surface. In the absence of lens 44, the output of detector 43 would vary with respect to the position on the input plane due to the variation in angle of the light emitted by laser 41 even though the light intensity remained constant as the angle varied. Similarly, when sample cell 42 is illuminated by laser 41 in the absence of lens 44, the light leaving output plane 47 in a region around the output spot would vary in angle in response to the variation in angle introduced by laser 41. Hence, the combination of laser 41 and sample cell 42 can be viewed as a variable angle light source.

In the above-described embodiments, the pivot point is imaged onto the detector by a lens. However, other optical systems that image the pivot point onto a point that is fixed with respect to the detector could be utilized. Such systems can include a plurality of lenses. In addition, reflective optical systems could also be utilized, particularly in broadband and mid-to-far infrared applications.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
    a variable angle light source characterized by a pivot point;
    a variable response optical receiver having a receiving surface, said variable response optical receiver receiving light generated by said variable angle light source on said receiving surface, said receiver generating a signal indicative of an intensity of light that impinges on a receiving surface; and
    a first optical system that images said pivot point to a fixed point relative to said receiving surface.

2. The apparatus of claim 1 wherein said first optical system is chosen such that light from said variable angle light source covers more than half said receiving surface.

3. The apparatus of claim 1 wherein said first optical system is chosen such that light from said variable angle light source covers all of said receiving surface.

4. The apparatus of claim 1 wherein said first optical system generates a light spot that is larger than said receiving surface, part of said light spot including said receiving surface.

5. The apparatus of claim 4 wherein said light spot has an area that is twice that of said receiving surface.

6. The apparatus of claim 1 wherein said fixed point is on said receiving surface.

7. The apparatus of claim 1 wherein said variable angle light source comprises a gain chip in a semiconductor laser.

8. The apparatus of claim 7 wherein said pivot point being located within 5 mm of a facet of said gain chip.

9. The apparatus of claim 7 wherein said variable angle light source comprises an external cavity laser.

10. The apparatus of claim 1 wherein said variable response optical receiver comprises a sample cell that is illuminated by said variable angle light source, said receiving surface comprising an input plane associated with said sample cell.

11. The apparatus of claim 10 wherein said first optical system images said pivot point onto a point that is fixed relative to said input plane.

12. The apparatus of claim 10 further comprising a second optical system that images a point on an output plane associated with said sample cell onto said fixed point relative to said receiving surface.

* * * * *